United States Patent
Song et al.

(10) Patent No.: US 10,822,449 B2
(45) Date of Patent: Nov. 3, 2020

(54) LOW TEMPERATURE CURING COMPOSITION, CURED FILM FORMED THEREFROM, AND ELECTRONIC DEVICE HAVING CURED FILM

(71) Applicant: SAMSUNG SDI CO., LTD., Yongin-si, Gyeonggi-do (KR)

(72) Inventors: Doori Song, Suwon-si (KR); Woo Han Kim, Suwon-si (KR); Dongju Shin, Suwon-si (KR); Hong Jeong Yu, Suwon-si (KR); Jiho Lee, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 239 days.

(21) Appl. No.: 15/747,244

(22) PCT Filed: Aug. 1, 2016

(86) PCT No.: PCT/KR2016/008430
§ 371 (c)(1),
(2) Date: Jan. 24, 2018

(87) PCT Pub. No.: WO2017/039159
PCT Pub. Date: Mar. 9, 2017

(65) Prior Publication Data
US 2018/0162989 A1 Jun. 14, 2018

(30) Foreign Application Priority Data
Aug. 31, 2015 (KR) .................. 10-2015-0122991

(51) Int. Cl.
C08G 59/30 (2006.01)
C09D 163/00 (2006.01)
C08L 63/00 (2006.01)
C09D 183/04 (2006.01)
H01L 51/50 (2006.01)
C08G 59/40 (2006.01)
H01L 51/00 (2006.01)
H01L 51/52 (2006.01)

(52) U.S. Cl.
CPC ........... C08G 59/306 (2013.01); C08G 59/30 (2013.01); C08G 59/4078 (2013.01); C08L 63/00 (2013.01); C09D 163/00 (2013.01); C09D 183/04 (2013.01); H01L 51/0034 (2013.01); H01L 51/50 (2013.01); H01L 51/5253 (2013.01)

(58) Field of Classification Search
CPC .. C08G 59/30; C08G 59/306; C08G 59/4078; C09D 163/00; C09D 183/04; C08L 63/00; H01L 51/0034; H01L 51/50; H01L 51/5253
USPC ......................................................... 524/588
See application file for complete search history.

(56) References Cited

U.S. PATENT DOCUMENTS

| | | |
|---|---|---|
| 5,512,605 A | 4/1996 | Eckberg et al. |
| 6,127,092 A | 10/2000 | Schon et al. |
| 8,861,916 B2 | 10/2014 | Bahadur et al. |
| 2004/0214018 A1 | 10/2004 | Frances et al. |
| 2006/0235178 A1 | 10/2006 | Wang et al. |
| 2008/0051553 A1 | 2/2008 | Furuta et al. |
| 2013/0331476 A1 | 12/2013 | Bae et al. |
| 2014/0154626 A1 | 6/2014 | Bujalski et al. |
| 2016/0024348 A1* | 1/2016 | Kim ..................... C09D 183/06 428/412 |

FOREIGN PATENT DOCUMENTS

| | | |
|---|---|---|
| JP | H 09176112 A | 7/1997 |
| JP | 2004-516101 A | 6/2004 |
| JP | 2006-131850 A | 5/2006 |
| JP | 2007-112956 A | 5/2007 |
| JP | 2008-179811 A | 8/2008 |
| JP | 2009-019205 A | 1/2009 |
| JP | 2009-280767 A | 12/2009 |

(Continued)

*Primary Examiner* — Angela C Scott
(74) *Attorney, Agent, or Firm* — Lee IP Law, PC

(57) ABSTRACT

Provided are a low temperature curing composition, a cured film obtained by curing the composition, and an electronic device comprising the cured film, wherein the composition comprises:

(A) an epoxy group-containing siloxane compound represented by Chemical Formula 1:

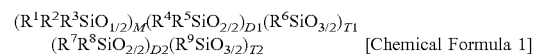

[Chemical Formula 1]

(In Chemical Formula 1, each of $R^1$ to $R^9$ is an organic group independently selected from a substituted or unsubstituted monovalent aliphatic hydrocarbon group of C1 to C6, a substituted or unsubstituted monovalent cycloaliphatic hydrocarbon group of C6 to C20, a substituted or unsubstituted monovalent aromatic hydrocarbon group of C6 to C20, and an epoxy-substituted monovalent organic group, at least one of R1 to R6 is an epoxy-substituted monovalent organic group, $0 \leq M < 1$, $0 \leq D1 < 1$, $0 < T \leq 1$, $0 \leq D2 < 1$, $0 \leq T2 < 1$, and $M + D1 + T1 + D2 + T2 = 1$, wherein each of the structural units represented by M, D1, T1, D2, and T2 can include one or more types of different structural units); and (B) a cationic thermal initiator for a ring-opening reaction of epoxide, the initiator being a salt of a sulfonium-based cation and a borate-based anion, wherein the compound represented by chemical formula 1 is a combination of a siloxane 1,000 and a siloxane compound of which a number average molecular weight is in a range of 1,000-10,000.

12 Claims, No Drawings

(56) References Cited

FOREIGN PATENT DOCUMENTS

| | | |
|---|---|---|
| JP | 2012-153642 A | 8/2012 |
| JP | 5000538 B2 | 8/2012 |
| JP | 5406466 B2 | 2/2014 |
| JP | 2016-009698 A | 1/2016 |
| KR | 10-2013-0069574 A | 6/2013 |
| KR | 10-2014-0004568 A | 1/2014 |
| KR | 10-1482687 B1 | 1/2015 |
| WO | WO 2015-060155 A1 | 4/2015 |

* cited by examiner

LOW TEMPERATURE CURING COMPOSITION, CURED FILM FORMED THEREFROM, AND ELECTRONIC DEVICE HAVING CURED FILM

TECHNICAL FIELD

A low temperature curing composition, a cured film formed therefrom, and a device having the cured film are disclosed.

BACKGROUND ART

A liquid crystal display (LCD) panel has a limit in realizing flexibility due to a backlight unit as a light source and a color filter for realizing a color. On the other hand, an organic light emitting diode (OLED) itself emits light when a current is applied thereto and thus draw attentions as an optimal display for realizing flexibility among many kinds of display. The organic light emitting diode (OLED) should have a film formed of an unbreakable material instead of breakable glass as a substrate in order to be realized into a flexible display.

On the other hand, an overcoat layer such as a touch screen panel (TSP), an optically clear adhesive (OCA) layer, or the like on OLED or TFT is used for planarization, and herein, a thickness decrease and planarization improvement of the overcoat layer, a noise decrease and touch sensitivity improvement between a TFT internal circuit and a touch sensor, and the like are important.

The overcoat layer requires an organic insulation effect to lower SNR (a signal to noise ratio) and needs to be uniformly planarized with a uniform thickness during the printing. When the overcoat layer has insufficient thickness uniformity, the insulation effect may be different at every part, and also have an influence on the subsequent process, such as a chemical vapor deposition (CVD), and the like, and thus reduce a process yield.

In addition, when the overcoat layer is deposited on OLED, the overcoat layer should have high transmittance for high luminance, and also play a role of an organic insulator, and thus have an insulation effect with a low dielectric constant. In addition, the overcoat layer should have physical characteristics of predetermined hardness after the coating to improve a problem such as haze, low hardness, and the like, which may occur during the CVD process.

DISCLOSURE

Technical Problem

An embodiment provides a low temperature curing composition cured at a low temperature to provide a cured material having high mechanical strength, high transmittance, a low dielectric constant, and excellent chemical resistance and generating small out-gas.

Another embodiment provides a cured film obtained by curing the composition.

Yet another embodiment provides an electronic device including the cured film.

Technical Solution

An embodiment provides low temperature curing composition including (A) an epoxy group-containing siloxane compound represented by Chemical Formula 1:

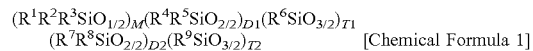

[Chemical Formula 1]

(in Chemical Formula 1, each of $R^1$ to $R^9$ are independently, an organic group independently selected from a substituted or unsubstituted C1 to C6 monovalent aliphatic hydrocarbon group, a substituted or unsubstituted C6 to C20 monovalent alicyclic hydrocarbon group, a substituted or unsubstituted C6 to C20 monovalent aromatic hydrocarbon group, and an epoxy-substituted monovalent organic group, at least one of $R^1$ to $R^6$ is an epoxy-substituted monovalent organic group, $0 \leq M < 1$, $0 < T1 \leq 1$, $0 \leq D2 < 1$, $0 \leq T2 < 1$, $M+D1+T1+D2+T2=1$, wherein each of the structural units represented by M, D1, T1, D2, and T2 include one or more types of different structural units); and (B) a cationic thermal initiator for a ring-opening reaction of epoxide, the initiator being a salt of a sulfonium-based cation and a borate-based anion, wherein the compound represented by Chemical Formula 1 is a combination of a siloxane compound of which a number average molecular weight is in a range of 100 to 1,000 and a siloxane compound of which a number average molecular weight is in a range of 1,000 to 10,000.

The compound represented by Chemical Formula 1 may be a mixture of 20 wt % or less of the siloxane compound of which a number average molecular weight is in a range of 100 to 1,000 and 80 wt % or greater of the siloxane compound of which a number average molecular weight is in a range of 1,000 to 10,000.

About 35 mol % to 100 mol % of siloxane units of the compound represented by Chemical Formula 1 may have an epoxy-substituted organic group.

In the compound represented by Chemical Formula 1, $0 \leq M \leq 0.3$, $0 \leq D1 < 0.7$, $0.3 \leq T1 \leq 1$, $0 \leq D2 < 0.7$, and $0 \leq T2 < 0.7$.

The epoxy-substituted monovalent organic group may be an epoxy-substituted monovalent aliphatic organic group, an epoxy-substituted monovalent alicyclic organic group, or an epoxy-substituted monovalent aromatic organic group.

The epoxy-substituted monovalent aliphatic organic group may include a glycidyl ether group or oxetanyl ether group.

The cationic thermal initiator for a ring-opening reaction of epoxide may be represented by Chemical Formula 2:

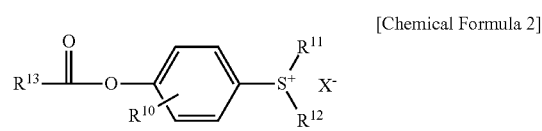

[Chemical Formula 2]

In Chemical Formula 2, $R^{10}$ to $R^{13}$ are independently selected from hydrogen, a substituted or unsubstituted C1 to C10 alkyl group, a substituted or unsubstituted C6 to C20 aryl group, a substituted or unsubstituted C2 to C20 heteroaryl group, or a combination thereof, and $X^-$ is a borate-based anion.

In Chemical Formula 2, $R^{10}$ to $R^{13}$ are independently hydrogen, C1 to C4 alkyl group, or a C6 to C10 aryl group substituted or unsubstituted with a C1 to C4 alkyl group.

The borate-based anion may be represented by Chemical Formula 3:

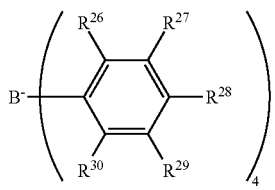

[Chemical Formula 3]

In Chemical Formula 3, $R^{26}$ to $R^{30}$ are independently, F, Cl, Br, or I.

The cationic thermal initiator for a ring-opening reaction may be included in an amount of about 0.01 wt % to about 5 wt % in the composition.

The composition may further include a solvent.

The composition may further include a polymerization inhibitor.

The composition may be cured at a temperature of 100° C. or less.

Another embodiment provides a cured film obtained by curing the composition.

The cured film may be an overcoat layer of an organic light emitting diode (OLED).

Another embodiment provides an electronic device having the cured film.

Advantageous Effects

A low temperature curing composition according to the embodiment is cured at 100° C. or less to have high mechanical strength, high transmittance, a low dielectric constant, and excellent chemical resistance and generates small out-gas and thus may be usefully used as an overcoat layer for a flexible display. In addition, the composition may be rapidly cured at a low temperature and thus may have an effect of shortening process time.

MODE FOR INVENTION

Hereinafter, embodiments of the present invention are described in detail. However, these embodiments are exemplary, the present invention is not limited thereto and the present invention is defined by the scope of claims.

In the present specification, when specific definition is not otherwise provided, "substituted" refers to replacement of at least one hydrogen by a halogen atom (F, Cl, Br, I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

In the present specification, when specific definition is not otherwise provided, "hetero" refers to inclusion of at least one hetero atom of N, O, S and P, in a chemical formula.

In the present specification, when specific definition is not otherwise provided, "(meth)acrylate" refers to both "acrylate" and "methacrylate", and "(meth)acrylic acid" refers to "acrylic acid" and "methacrylic acid".

In the present specification, when a specific definition is not otherwise provided, the term "combination" refers to mixing or copolymerization.

An embodiment provides a low temperature curing composition including (A) an epoxy group-containing siloxane compound represented by Chemical Formula 1:

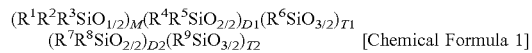

[Chemical Formula 1]

(in Chemical Formula 1, each of $R^1$ to $R^9$ are independently, an organic group independently selected from a substituted or unsubstituted C1 to C6 monovalent aliphatic hydrocarbon group, a substituted or unsubstituted C6 to C20 monovalent alicyclic hydrocarbon group, a substituted or unsubstituted C6 to C20 monovalent aromatic hydrocarbon group, and an epoxy-substituted monovalent organic group, at least one of $R^1$ to $R^6$ is an epoxy-substituted monovalent organic group, $0 \leq M < 1$, $0 \leq D1 < 1$, $0 < T1 \leq 1$, $0 \leq D2 < 1$, $0 \leq T2 < 1$, $M+D1+T1+D2+T2=1$, wherein each of the structural units represented by M, D1, T1, D2, and T2 include one or more types of different structural units); and (B) a cationic thermal initiator for a ring-opening reaction of epoxide, the initiator being a salt of a sulfonium-based cation and a borate-based anion, wherein the compound represented by Chemical Formula 1 is a combination of a siloxane compound of which a number average molecular weight is in a range of 100 to 1,000 and a siloxane compound of which a number average molecular weight is in a range of 1,000 to 10,000.

An interlayer insulating layer to insulate wires disposed between layers is used in TFT-LCD or an integrated circuit device. The interlayer insulating layer is formed through a series of process, for example, coating, prebaking, exposing to light, developing, and postbaking a photosensitive resin composition.

A conventional negative interlayer insulating layer comprises a binder, a reactive unsaturated compound, a photopolymerization initiator, a solvent, and the like, and herein, the binder includes an olefin-based unsaturated compound to handle heat resistance of the interlayer insulating layer. However, the conventional olefin-based unsaturated compound has a curing temperature of 150° C. or greater and thus may not be cured at a low temperature of 100° C. or less and not applied to a flexible display-manufacturing process. Accordingly, development of a binder and a curing system capable of being easily synthesized and supplied as well as cured at a considerably lower temperature than the conventional organic layer has been demanded.

An attempt to realize low temperature property of an acryl-based copolymer or an epoxy silicon composition itself by introducing an epoxy group thereinto has been made. However, the acryl-based copolymer including the epoxy group may hardly secure desired hardness at a low temperature. In addition, the silicon composition has low surface hardness and shows a haze phenomenon due to a high non-curing rate at 100° C. or less despite an attempt to improve characteristics such as mechanical strength and the like by forming an ethylene chain through a reaction between alkene and hydrogen, a hydrosilylation reaction. In addition, the silicon composition is not completely cured at 100° C. or less despite an epoxy ring-opening polymerization by using an epoxy catalyst and thus has a problem of a surface hardness decrease and a transmittance deterioration.

When the surface hardness is low, a haze phenomenon occurs after CVD, and thus another reaction mechanism is required.

The present inventors discovered a cured film having high mechanical strength and simultaneously, high transmittance, a low dielectric constant, and excellent chemical resistance and etch resistance, generating small out-gas, and causing no haze as well as cured at a low temperature by blending siloxane compounds including an epoxy-substituted organic group as a substituent and having different molecular weights one another and adding a cationic thermal initiator causing an epoxy ring-opening reaction at a low temperature, for example, 100° C. or less thereto, and curing the obtained composition and thus completed the present invention. This cured film is applied as an overcoat layer of OLED and the like and usefully used to manufacture a flexible display.

The composition may further include a solvent to realize appropriate viscosity and the like.

In addition, the composition may further include a polymerization inhibitor to secure storage-stability.

Hereinafter, each component of the low temperature curing composition according to the embodiment is described in detail.

(A) Epoxy Group-Containing Siloxane Compound

A low temperature curing composition according to an embodiment includes a siloxane compound including an epoxy-substituted monovalent organic group represented by Chemical Formula 1:

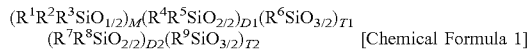
[Chemical Formula 1]

In Chemical Formula 1, $R^1$ to $R^9$ are independently an organic group independently selected from a substituted or unsubstituted C1 to C6 monovalent aliphatic hydrocarbon group, a substituted or unsubstituted C6 to C20 monovalent alicyclic hydrocarbon group, a substituted or unsubstituted C6 to C20 monovalent aromatic hydrocarbon group, and an epoxy-substituted monovalent organic group, at least one of $R^1$ to $R^6$ is an epoxy-substituted monovalent organic group, $0 \leq M<1$, $0 \leq D1<1$, $0 \leq T1 \leq 1$, $0 \leq D2<1$, $0 \leq T2<1$, $M+D1+T1+D2+T2=1$, wherein each of the structural units represented by M, D1, T1, D2, and T2 include one or more types of different structural units.

Particularly, the compound represented by Chemical Formula 1 includes a mixture of a siloxane compound of which a number average molecular weight is in a range of 100 to 1,000 and a siloxane compound of which a number average molecular weight is in a range of 1,000 to 10,000.

For example, the compound represented by Chemical Formula 1 includes a combination of 20 wt % or less of the siloxane compound of which a number average molecular weight is in a range of 100 to 1,000 and 80 wt % or greater of the siloxane compound of which a number average molecular weight is in a range of 1,000 to 10,000.

In an example embodiment, the compound represented by Chemical Formula 1 includes a combination of 15 wt % or less, for example, 1.0 wt % to 12 wt %, for example 1.5 wt % to 8.5 wt % of the siloxane compound of which a number average molecular weight is in a range of 100 to 1,000, and 85 wt % or greater, for example, 88 wt % to 99 wt %, for example, 91.5 wt % to 98.5 wt % of the siloxane compound of which a number average molecular weight is in a range of 1,000 to 10,000.

When the siloxane compound of which a number average molecular weight is in a range of 100 to 1,000 and the siloxane compound of which a number average molecular weight is in a range of 1,000 to 10,000 are included within each range, the composition according to the embodiment may provide a sufficient surface hardness and a mechanical strength by being cured at a low temperature, for example, 100° C. or less by a thermal initiator for a ring-opening reaction of epoxide that will be described later.

Since the siloxane compound having a number average molecular weight in a range of 1,000 to 10,000 has very large reactivity, when included out of the range, the siloxane compound may cause a problem of storage-stability and the like. In addition, the siloxane compound may have a problem that a reaction occurs at a stirring temperature after prepared into a composition and the like.

About 35 mol % to 100 mol % of siloxane units of the compound represented by Chemical Formula 1 may have an epoxy-substituted organic group.

When the compound represented by Chemical Formula 1 has a siloxane unit having an epoxy-substituted organic group within the range, the composition according to the embodiment is cured by a post-described thermal initiator for a ring-opening reaction of epoxide at a lower temperature, for example, 100° C. or less and thus may provide sufficient surface hardness and mechanical strength.

When the epoxy-substituted organic group is present in an amount of less than 35 wt % of the siloxane unit of the compound represented by Chemical Formula 1, the composition according to the embodiment may have an epoxy group cross-linked with other siloxane compounds due to the epoxy ring-opening reaction in a low ratio and thus fail in providing a cured film having sufficient surface hardness and mechanical strength after the curing.

In the compound represented by Chemical Formula 1, $0 \leq M \leq 0.3$, $0 \leq D1<0.7$, $0.3 \leq T1 \leq 1$, $0 \leq D2<0.7$, and $0 \leq T2<0.7$.

In an example embodiment, in the compound represented by Chemical Formula 1, $M=0$, $D1=0$, $0.3 \leq T1 \leq 1$, $D2=0$, and $0 \leq T2<0.7$, for example, $M=0$, $D1=0$, $0.5 \leq T1 \leq 1$, $D2=0$, and $0 \leq T2<0.5$.

The epoxy-substituted monovalent organic group may be an epoxy-substituted monovalent aliphatic organic group, an epoxy-substituted monovalent alicyclic organic group, or an epoxy-substituted monovalent aromatic organic group.

In an example embodiment, the epoxy-substituted monovalent organic group may be an epoxy-substituted monovalent aliphatic organic group, and the epoxy-substituted monovalent aliphatic organic group may be a glycidyl ether group or an oxetanyl ether group.

For example, the epoxy-substituted monovalent aliphatic organic group including a glycidyl ether group may be a 3-glycidoxy-propyl group.

The compound represented by Chemical Formula 1 may be for example, obtained by hydrolysis and condensation polymerization of at least one selected from a monomer represented by $R^1R^2R^3SiZ^1$, a monomer represented by $R^4R^5SiZ^2Z^3$, a monomer represented by $R^6SiZ^4Z^5Z^6$, a monomer represented by $R^7R^8SiZ^7Z^8$, and a monomer represented by $R^9SiZ^9Z^{10}Z^{11}$. Herein definitions of $R^1$ to $R^9$ are the same as described above, $Z^1$ to $Z^{11}$ are independently C1 to C6 alkoxy group, a hydroxy group, a halogen, a carboxyl group, or a combination thereof.

The hydrolysis and condensation polymerization reaction for preparing a compound represented by Chemical Formula 1 may be generally well known to those who have common knowledge in a related art. For example, the hydrolysis and condensation polymerization reaction may including adding a solvent, water, and if desired, a catalyst to a mixture of the monomers and stirring the obtained mixture at 50° C. to 150° C., for example, 90° C. to 130° C. for 0.5 to 50 hours. In addition, a hydrolysis byproduct (alcohol, such as methanol, and the like) or a condensation byproduct may be if necessary distilled and removed while stirred.

The reaction solvent has no particular limit but may include the same solvent as included in a low temperature curing composition including a compound represented by Chemical Formula 1 according to the embodiment.

The solvent may be used in an amount of 10 to 1000 parts by weight based on 100 parts by weight of a weight sum of the monomers. In addition, the water used during the hydrolysis reaction is added in an amount range of 0.5 mol to 4.5 mol based on one mol of a hydrolytic group.

The catalyst added if necessary has no particular limit but may be an acid catalyst, a base catalyst, and the like. The catalyst may be used in an amount of 0.001 to 10 parts by weight based on 100 parts by weight of a weight sum of the monomers.

(B) Cationic Thermal Initiator for Ring-Opening Reaction of Epoxide

The cationic thermal initiator for a ring-opening reaction of epoxide may be a salt of a sulfonium-based cation and a borate-based anion and initiate a ring-opening reaction of epoxide at a temperature of 100° C. or less, for example, from 75° C. or greater to 90° C. or less, and accordingly, a composition including the cationic thermal initiator for a ring-opening reaction of epoxide according to an embodiment may be cured at a low temperature, for example, less than and equal to 90° C., and for example, 80° C. or less.

The cationic thermal initiator for a ring-opening reaction of epoxide may be represented by Chemical Formula 2:

[Chemical Formula 2]

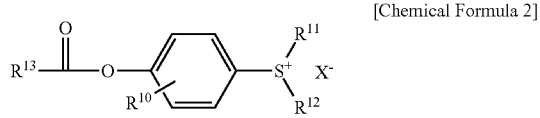

In Chemical Formula 2, $R^{10}$ to $R^{13}$ are independently selected from hydrogen, a substituted or unsubstituted C1 to C10 alkyl group, a substituted or unsubstituted C6 to C20 aryl group, a substituted or unsubstituted C2 to C20 heteroaryl group, or a combination thereof, and $X^-$ is a borate-based anion.

In Chemical Formula 2, $R^{10}$ to $R^{13}$ may independently be hydrogen, a C1 to C4 alkyl group, or a C6 to C10 aryl group substituted or unsubstituted with a C1 to C4 alkyl group.

In an example embodiment, $R^{10}$ may be hydrogen or a C1 to C4 alkyl group, one of $R^{11}$ and $R^{12}$ may be a C1 to C4 alkyl group, and the other may be a C1 to C4 alkyl group, or a naphthyl group substituted or unsubstituted with a C1 to C4 alkyl group, or a C6 to C20 arylalkyl group, and $R^{13}$ may be a C1 to C4 alkyl group, for example, a methyl group.

The borate-based anion may be represented by Chemical Formula 3:

[Chemical Formula 3]

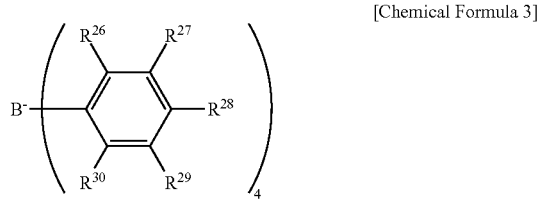

In Chemical Formula 3, $R^{26}$ to $R^{30}$ are independently, F, Cl, Br, or I.

In an example embodiment, $R^{26}$ to $R^{30}$ may be all F.

For example, the thermal initiator for a ring-opening reaction of epoxide may be 4-acetoxyphenyl methyl benzyl sulfonium.tetrakis(2,3,4,5,6-pentafluorophenyl) borate represented by Chemical Formula 4, or 4-acetoxyphenyl methyl (2-methyl benzyl) sulfonium.tetrakis(pentafluorophenyl) borate, 4-acetoxyphenyl 3-methyl phenylbenzylmethylsulfonium.tetrakis(pentafluorophenyl) borate, and the like, but is not limited thereto.

[Chemical Formula 4]

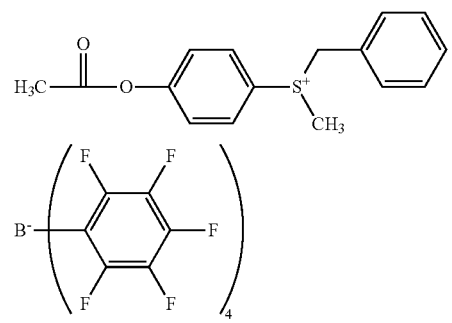

The cationic thermal initiator for a ring-opening reaction of epoxide may be included in an amount of about 0.01 wt % to about 5 wt %, for example about 0.05 wt % to about 4 wt %, for example about 0.1 wt % to about 3 wt % in the composition according to the embodiment.

Within the range, the cationic thermal initiator for a ring-opening reaction of epoxide may open epoxy groups substituted in the compound represented by Chemical Formula 1 at 100° C. or less and causes a condensation reaction with other siloxane compounds, and thus provide a cured film having sufficient surface hardness at a low temperature of 100° C. or less. Accordingly, the composition according to the embodiment, and a cured film formed from the composition may be used as an overcoat layer on OLED and the like, and thus usefully applied to manufacture a flexible display.

(C) Solvent

The low temperature curing composition according to an embodiment may further include a solvent in order to adjust viscosity, and the like. The solvent may be a material having compatibility with the compound represented by Chemical Formula 1 and the thermal initiator for a ring-opening reaction of epoxide, but not reacting with them.

Examples of the solvent may be alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, diethylene glycol dimethylether, and the like; cellosolve acetates such as methyl cellosolve acetate, ethyl cellosolve acetate, diethylcellosolve acetate, and the like; carbitols such as methylethylcarbitol, diethylcarbitol, diethylene glycol monomethylether, diethylene glycol monoethylether, diethylene glycol dimethylether, diethylene glycol methylethylether, diethylene glycol diethylether, and the like; propylene glycol alkyletheracetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, ethyl benzoate, diethyl oxalate, diethyl maleate, γ-butyrolactone, ethylene carbonate, propylene carbonate, phenyl cellosolve acetate, and the like.

Among them, considering miscibility and reactivity, glycol ethers such as ethylene glycolmonoethylether, diethylene glycoldimethylether, and the like; ethylene glycolalkyletheracetates such as ethyl cellosolve acetate, and the like; esters such as 2-hydroxy ethyl propionate, and the like; carbitols such as diethylene glycolmonomethylether, and the like; propylene glycolalkyletheracetates such as propylene glycolmonomethylether acetate, propylene glycol propylether acetate, and the like may be preferably used.

The solvent may be used in an amount of about 10 parts by weight to about 10,000 parts by weight based on 100 parts by weight of the compound represented by Chemical Formula 1, and may be included in the composition according to the embodiment in a desirable amount by a person having an ordinary skill in this art within a range to implement an appropriate viscosity for coating the composition on a lower substrate.

(D) Polymerization Inhibitor and Other Additives

A low temperature curing composition according to an embodiment may further include a polymerization inhibitor.

The siloxane compound represented by Chemical Formula 1 has relatively large polymerization reactivity at room temperature and may have an increasing molecular weight due to a polymerization reaction even during a cold storage at room temperature or 10° C. or less. In order to prevent this and realize storage-stability of the compound, the composition according to an embodiment may further include a polymerization inhibitor.

As for the polymerization inhibitor, a sulfonium-based compound having a similar structure to that of the thermal initiator for a ring-opening reaction of epoxide and cross-linked at a higher temperature than the thermal initiator may be used. For example, (4-hydroxyphenyl)dimethyl sulfonium.methyl sulfate (salt), 4-(methylthio)phenol and the like may be used.

When the polymerization inhibitor is used, it may be used in a small amount of about 3 wt % or less, for example, about 1 wt % or less, for example, about 0.5 wt % or less, for example, about 0.1 wt % or less, for example, about 0.05 wt % or less, for example, about 0.03 wt % or less, for example, about 0.02 wt % or less based on a total weight of the composition.

The composition according to the embodiment may further include an additional additive as follows, in addition to the polymerization inhibitor.

For example, the composition may further include malonic acid; 3-amino-1,2-propanediol; a silane-based coupling agent including a vinyl group or a (meth)acryloxy group; a fluorine-based surfactant; or a combination thereof.

For example, it may further include a silane-based coupling agent having a reactive substituent such as a vinyl group, a carboxyl group, a methacryloxy group, an isocyanate group, an epoxy group, and the like, in order to improve a close contacting property between the low temperature curing composition and a lower substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like, and may be used alone or in a mixture of two or more.

The silane-based coupling agent may be included in an amount of 0.01 parts by weight to 10 parts by weight based on 100 parts by weight of the low temperature curing composition. When the silane-based coupling agent is included within the range, a close contacting property, storage capability, and the like may be improved.

In addition, the composition according to the embodiment may further include a surfactant, for example a fluorine-based surfactant as needed in order to improve coating properties and inhibit generation of spots.

The fluorine-based surfactant may be BM-1000® and BM-1100® of BM Chemie Inc.; MEGAFACE F 142D®, F 172®, F 173®, and F 183° of Dainippon Ink Kagaku Kogyo Co., Ltd.; FULORAD FC-135®, FULORAD FC-170C®, FULORAD FC-430®, and FULORAD FC-431® of Sumitomo 3M Co., Ltd.; SURFLON S-112®, SURFLON S-113®, SURFLON S-131®, SURFLON S-141®, and SURFLON S-145® of ASAHI Glass Co., Ltd.; and SH-28PA®, SH-190®, SH-193®, SZ-6032®, and SF-8428®, and the like of Toray Silicone Co., Ltd.

The surfactant may be included in an amount of 0.01 parts by weight to 5 parts by weight based on 100 parts by weight of the composition. When the surfactant is included within the range, coating uniformity may be ensured, spots may not be generated, and wetting for a glass substrate may be improved.

In addition, the low temperature curing composition may further include other additives such as an antioxidant, a stabilizer, and the like in a predetermined amount, unless properties are deteriorated.

The low temperature curing composition may be a negative-type photosensitive resin composition.

The low temperature curing composition may be cured at a low temperature of 100° C. or less, for example 90° C. or less, for example 75° C. or greater and 90° C. or less.

Another embodiment provides a cured film manufactured using the low temperature curing composition.

The cured film may be manufactured by coating the composition according to the embodiment to have a desired thickness, for example, a thickness ranging from 1 μm to 30 μm, on a substrate which undergoes a predetermined pre-treatment, using a spin or slit coating method, a roll coating method, a screen-printing method, an applicator method, and the like, heating at a temperature of 70° C. to 90° C. for 1 minute to 1 hour to initiate a ring-opening reaction of the epoxy group of the compound represented by Chemical Formula 1, and subsequently heating the composition at the temperature to cure it within a low temperature range and provide a high surface hardness.

This obtained cured film has high surface hardness even though cured at a temperature and thus high mechanical strength, in addition, excellent chemical resistance and etch resistance, high light transmittance, and a low dielectric constant, generates small out-gas, and causes no haze after CVD as described later in the following examples.

Hereinafter, examples of the present invention are described. These examples, however, are not in any sense to be interpreted as limiting the scope of the invention.

EXAMPLES

Preparation Example

Synthesis of Siloxane Compound

Synthesis Example 1

Preparation of Epoxy Group-Containing Siloxane Compound

One kg of a mixed solvent of water and toluene was put in a 3-necked flask and then, stirred with 300 g of glycidoxypropyl trimethoxysilane over 2 hours, while the flask was maintained at 23° C. When the stirring was complete, the reactant was heated at 90° C. for 3 hours to perform a condensation polymerization reaction. Subsequently, the resultant was cooled down to room temperature, and an aqueous layer was removed therefrom to obtain a solution of a polymer dissolved in toluene. The obtained polymer solution was washed with water to remove a reaction byproduct. The polymer solution was distilled under a reduced pressure to remove the toluene and obtain an epoxy group-containing siloxane compound having a number average molecular weight of 2198 g/mole and represented by Chemical Formula 5. The number average molecular weight was measured by using a RI detector of Empower GPC made by Waters Corp.

$(OCH_2CHCH_2OCH_2CH_2CH_2SiO_{3/2})_{1.0}$ (a number average molecular weight: 2198 g/mole)  [Chemical Formula 5]

Synthesis Example 2

Preparation of Epoxy Group-Containing Siloxane Compound

One kg of a mixed solvent of water and toluene was put in a 3-necked flask and then, stirred with 300 g of glycidoxypropyltrimethoxysilane(glycidoxypropyltrimethoxysilane) over 2 hours, with the flask was maintained at 23° C. When the stirring was complete, the reactant was heated at 90° C. for 3 hours to perform a condensation polymerization reaction. Subsequently, the resultant was cooled down to room temperature, and an aqueous layer was removed therefrom to obtain a solution of a polymer dissolved in toluene. The obtained polymer solution was washed with water to remove a reaction byproduct. The polymer solution was distilled under a reduced pressure to remove the toluene to obtain an epoxy group-containing siloxane compound having a number average molecular weight of 721 g/mole and represented by Chemical Formula 6. The number average molecular weight was measured by using a RI detector of Empower GPC made by Waters Corp.

$(OCH_2CHCH_2OCH_2CH_2CH_2SiO_{3/2})_{1.0}$ (a number average molecular weight: 721 g/mole)  [Chemical Formula 6]

Synthesis Example 3

Preparation of Epoxy Group-Containing Siloxane Compound

One kg of a mixed solvent of water and toluene was put in a 3-necked flask and then, mixed and stirred with 350 g of glycidoxypropyltrimethoxysilane and 25 g of methyltrimethoxysilane over 2 hours, while the flask was maintained at 23° C. When the stirring was complete, the reactant was heated at 90° C. for 3 hours to perform a condensation polymerization reaction. Subsequently, the resultant was cooled down to room temperature to remove an aqueous layer therefrom and obtain a solution of a polymer dissolved in toluene. The obtained polymer solution was washed with water to remove a reaction byproduct. The polymer solution was distilled under a reduced pressure to remove the toluene and obtain an epoxy group-containing siloxane compound having a number average molecular weight of 2781 g/mole and represented by Chemical Formula 7. The number average molecular weight was measured by using a RI detector of Empower GPC made by Waters Corp.

$(OCH_2CHCH_2OCH_2CH_2CH_2SiO_{3/2})_{0.9}$
$(CH_3SiO_{3/2})_{0.1}$ (a number average molecular weight: 2781 g/mole)  [Chemical Formula 7]

Synthesis Example 4

Preparation of Epoxy Group-Containing Siloxane Compound

One kg of a mixed solvent of water and toluene was put in a 3-necked flask and then, mixed and stirred with 350 g of glycidoxypropyltrimethoxysilane and 25 g of methyltrimethoxysilane over 2 hours, while the flask was maintained at 23° C. When the stirring was complete, the reactant was heated at 90° C. for 3 hours to perform a condensation polymerization reaction. Subsequently, the resultant was cooled down to room temperature to remove an aqueous layer therefrom and obtain a polymer solution dissolved in toluene. The obtained polymer solution was washed with water to remove a reaction product. The polymer solution was distilled under a reduced pressure to remove the toluene and obtain an epoxy group-containing siloxane compound having a number average molecular weight of 4133 g/mole and represented by Chemical Formula 8. The number average molecular weight was measured with RI detector of Empower GPC made by Waters Corp.

$(OCH_2CHCH_2OCH_2CH_2CH_2SiO_{3/2})_{0.9}$
$(CH_3SiO_{3/2})_{0.1}$ (a number average molecular weight: 4133 g/mole)  [Chemical Formula 8]

Comparative Synthesis Example 1

Preparation of Alkenyl Group-Containing Siloxane Compound

One kg of a mixed solvent of water and toluene was put in a 3-neck flask and then, mixed and stirred with 82 g of phenylmethyl dimethoxysilane and 214 g of phenyltrimethoxysilane over 2 hours, while the flask was maintained at 23° C. When the stirring was complete, the reactant was heated at 90° C. for 3 hours to perform a condensation polymerization reaction. Subsequently, 44 g of divinyltetramethyldisiloxane was added thereto to perform an end-cap reaction for 5 hours. The reactant was cooled down to room temperature to remove an aqueous layer and prepare a solution of a polymer dissolved in toluene. The obtained polymer solution was washed with water to remove a reaction byproduct. The polymer solution was distilled under a reduced pressure to remove the toluene and obtain an alkenyl group-containing siloxane compound having a number average molecular weight of 3218 g/mole and represented by Chemical Formula 9. The number average molecular weight was measured by using a RI detector of Empower GPC made by Waters Corp.

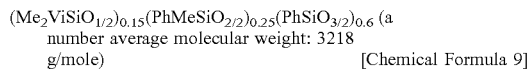
(a number average molecular weight: 3218 g/mole) [Chemical Formula 9]

Comparative Synthesis Example 2

Hydrogen-Containing Siloxane Compound

One kg of a mixed solvent of water and toluene was put in a 3-necked flask and then, mixed and stirred with 200 g of tetramethyldisiloxane over one hour, while the flask was maintained at 17° C. When the stirring was complete, 250 g of diphenyldichloro silane was added thereto in a dropwise fashion over 5 hours. Subsequently, an aqueous layer was removed therefrom at room temperature to prepare a solution of a polymer dissolved in toluene. The obtained solution was washed with water to remove a byproduct. The polymer solution was distilled under a reduced pressure to remove the toluene and obtain a hydrogen-containing siloxane compound having a number average molecular weight of 332 g/mole and represented by Chemical Formula 10. The number average molecular weight was measured by using a RI detector of Empower GPC made by Waters Corp.

$(Me_2HSiO_{1/2})_{0.67}(Ph_2SiO_{2/2})_{0.33}$ (a number average molecular weight: 332 g/mole) [Chemical Formula 10]

Examples 1 to 7 and Comparative Examples 1 to 5

Preparation and Evaluation of Curing Composition

The siloxane compounds according to Synthesis Examples 1 and 2 in a ratio shown in Table 1 were mixed with 0.2 wt % of 4-acetoxyphenyl benzyl methyl sulfonium tetrakis(pentafluoro phenyl) borate (Example 1), 0.2 wt % of 4-acetoxyphenyl methyl (2-methyl benzyl) sulfonium tetrakis(pentafluoro phenyl) borate (Example 2), and 0.2 wt % of 4-acetoxyphenyl 3-methyl phenylbenzyl methyl sulfonium tetrakis(pentafluoro phenyl) borate (Example 3) as a cationic thermal initiator for a ring-opening reaction to prepare each curing composition according to Examples 1 to 3.

In addition, the siloxane compounds according to Synthesis Examples 2 to 4 in ratios shown in Table 1 was mixed with (4-acetyloxy)phenyl]methyl(phenylmethyl)sulfonium.tetrakis(2,3,4,5,6-pentafluorophenyl)borate in each amount of 0.15 wt % (Example 4), 0.5 wt % (Example 5), 0.15 wt % (Example 6), and 1.0 wt % (Example 7) as a thermal initiator for a ring-opening reaction of epoxide and in addition, 0.015 wt % of S-ME (Sanshin Chemical Industry Co., Ltd.) as a polymerization inhibitor to prepare each curing composition according to Examples 4 to 7.

The siloxane compounds according to Comparative Synthesis Examples 1 and 2 in ratios shown in Table 1 were mixed with 3 ppm of Pt-CS 2.0 (Unicore) as a hydrosilylation catalyst to prepare a curing composition according to Comparative Example 1.

In addition, the siloxane compounds according to Synthesis Examples 2 and 3 in a ratio shown in Table 1 were mixed with O,O-diethyl ester phosphorodithioic acid as an epoxy catalyst and 1.5 wt % of tetrabutyl phosphonium to prepare a curing composition according to Comparative Example 2.

In addition, the siloxane compounds according to Synthesis Examples 1 and 2 in a ratio shown in Table 1 were mixed with 0.2 wt % of 4-acetoxyphenyl (methyl)2-naphthyl methyl sulfonium hexafluoro antimonate (Comparative Example 3), 0.2 wt % of 4-acetoxyphenyl benzylmethyl sulfonium hexafluoro antimonate (Comparative Example 4), and 0.2 wt % of 4-acetoxyphenyl dimethyl sulfonium hexafluoro phosphate (Comparative Example 5) as a cationic thermal initiator to prepare each curing composition according to Comparative Examples 3 to 5.

Specifically, a method of preparing the curing compositions may include respectively putting the siloxane compounds according to Synthesis Examples 1 to 4 or Comparative Synthesis Examples 1 and 2 in a combination and an amount shown in Table 1 in a flask and adding a thermal initiator for a ring-opening reaction of epoxide, an epoxy catalyst, a hydrosilylation catalyst, or additionally a polymerization inhibitor thereto.

The curing compositions were respectively coated on a glass substrate with a screen printing equipment and cured in an 85° C. oven for 1 hour to obtain each 10 µm-thick cured film.

Hardness, transmittance, haze, a dielectric constant, chemical resistance, and out-gasing of the cured films were measured, and the results are shown in Table 1.

1) Hardness: The cured film was sufficiently cooled down to room temperature and measured according to an ASTM D3363 test standard with a pencil hardness tester, HEIDON made by Shinto Scientific Co., Ltd. in a JIS K5600 method. The pencil hardness was measured within a range of 6B to 9H at room temperature.

2) Transmittance: Transmittance was measured from 280 nm to 800 nm with an UV transmittance equipment (UV-1800 equipment, SHIMADZU Corp.), and the transmittance at 450 nm was used as a representative value.

3) Haze after CVD: SiNx 3000 Å was formed in a CVD (Chemical Vapor Deposition) method on the cured film. Then, a haze index was measured by using a hazemeter (NDH2000, Nippon Denshoku Industries Co., Ltd.).

4) Dielectric Constant: A dielectric constant was measured with 100 kHz by respectively coating the curing compositions on a chromium (Cr) substrate instead of the glass substrate and curing them at 85° C. for 1 hour to form each 10 µm-thick coating layer and depositing an aluminum layer thereon.

The dielectric constant ($E_r$) at each frequency was obtained according to the following formula by selecting any electrode 3EA per specimen, measuring capacitance at each frequency with a precision impedance analyzer made by Wayne Kerr Electronics Inc. (Model: 4294A, HP), and calculating an average.

$$\varepsilon_r = C/\varepsilon_0 \times t/A$$

Herein,
$\varepsilon_r$: a dielectric constant,
$\varepsilon_0$: a vacuum dielectric constant, $\varepsilon_0 = 8.854 \times 10^{-14}$ [F/cm]
t: a thickness (cm), 1 µm=$1 \times 10^{-4}$ cm
A: an area (cm$^2$).

5) Chemical Resistance: After measuring an initial thickness of the cured film (10 µm), the cured film was allowed to stand in an NMP solvent at 60° C. for 3 minutes, washed with ultra pure water for 30 seconds, and dried by blowing compressed air. Then, a thickness of the cured film was remeasured, and chemical resistance was evaluated through a thickness change ratio of the film. Herein, the thickness was measured by using Alpha-step, Surface profiler KLA tencor.

6) Out-gasing: Out-gasing was evaluated through an quantitive analysis by cutting each cured film to secure 9 pieces having a 1 cm-wide and 5 cm-long size and then, catching gas at 100° C. for 60 minutes with a Headspace GC equipment (Dong-il Shimadzu Corp.).

TABLE 1

|  | Example 1 | Example 2 | Example 3 | Example 4 | Example 5 | Example 6 | Example 7 | Comparative Example 1 | Comparative Example 2 | Comparative Example 3 | Comparative Example 4 | Comparative Example 5 |
|---|---|---|---|---|---|---|---|---|---|---|---|---|
| Comparative Synthesis Example 1 | — | — | — | — | — | — | — | 75.0 | — | — | — | — |
| Comparative Synthesis Example 2 | — | — | — | — | — | — | — | 25.0 | — | — | — | — |
| Hydrosilylation catalyst Pt | — | — | — | — | — | — | — | 3 ppm | — | — | — | — |
| Synthesis Example 1 | 94.8 | 94.8 | 94.8 | — | — | — | — | — | — | 94.8 | 94.8 | 94.8 |
| Synthesis Example 2 | 5.0 | 5.0 | 5.0 | 1.5 | 1.5 | 1.5 | 1.5 | — | 1.5 | 5.0 | 5.0 | 5.0 |
| Synthesis Example 3 | — | — | — | 98.3 | 98.0 | — | 97.5 | — | 97.0 | — | — | — |
| Synthesis Example 4 | — | — | — | — | — | 98.3 | — | — | — | — | — | — |
| Ring-opening reaction of epoxide initiator | 0.2 | 0.2 | 0.2 | 0.15 | 0.5 | 0.15 | 1.0 | — | — | 0.2 | 0.2 | 0.2 |
| Epoxy catalyst | — | — | — | — | — | — | — | — | 1.5 | — | — | — |
| Polymerization inhibitor | — | — | — | 0.015 | 0.015 | 0.015 | 0.015 | — | — | — | — | — |
| Hardness (Pencil hardness, 1 kg) | 4 H | 6 H | 4 H | 3 H | 3 H | 3 H | 3 H | <6 B | <6 B | 2 H | H | H |
| Transmittance (450 nm, %) | 99.6 | 99.8 | 99.6 | 99.6 | 99.7 | 99.7 | 99.7 | 99.3 | 99.4 | 99.3 | 99.6 | 99.5 |
| Haze meter after CVD | 0.1 | 0.1 | 0.1 | 0.1 | 0.1 | 0.1 | 0.1 | >30 | >30 | 1.8 | 2.0 | 1.5 |
| Dielectric constant ($\varepsilon'$) | 4.15 | 3.50 | 3.81 | 4.12 | 4.25 | 3.71 | 3.53 | 3.13 | 5.68 | 4.31 | 4.26 | 4.03 |
| Chemical resistance (decrease of film thickness, %) | 0.2 | 0.1 | 0.4 | 0.4 | 0.6 | 0.8 | 1.5 | 0.5 | 6.3 | 5.8 | 17.4 | 7.6 |
| Out-gasing (%) | 0.2 | 0.1 | 0.3 | 0.3 | 0.3 | 0.2 | 2.0 | 0.6 | 2.0 | 2.4 | 7.5 | 5.1 |

Referring to Table 1, a composition according to the embodiment, which includes a combination of two siloxane compounds both including epoxy substituents while having different molecular weights from each other, and a particular thermal initiator for a ring-opening reaction of epoxide, which is a salt of sulfonium ion and borate ion, may provide a cured film having high surface hardness and chemical resistance, excellent transmittance and haze characteristics after CVD, small out-gassing, and a low dielectric constant, compared with a cured from a composition not including the thermal initiator for a ring-opening reaction of epoxide, since the ring of the epoxy groups of the siloxane compounds opens reaction at a low temperature, for example, 100° C. or less, for example, 90° C. or less.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A low temperature curing composition, comprising:
a first epoxy group-containing siloxane compound represented by Chemical Formula 1, the first epoxy group-containing siloxane compound having a number average molecular weight of 100 to 1,000 g/mol;

a second epoxy-group containing siloxane compound represented by Chemical Formula 1, the second epoxy-group containing siloxane compound having a number average molecular weight of 1,000 to 10,000 g/mol, the second epoxy group-containing compound being different from the first epoxy group-containing compound; and a cationic thermal initiator represented by Chemical Formula 2,

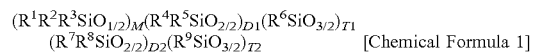

[Chemical Formula 1]

wherein, in Chemical Formula 1, each of $R^1$ to $R^9$ is independently an organic group selected from a substituted or unsubstituted C1 to C6 monovalent aliphatic hydrocarbon group, a substituted or unsubstituted C6 to C20 monovalent alicyclic hydrocarbon group, a substituted or unsubstituted C6 to C20 monovalent aromatic hydrocarbon group, and an epoxy-substituted monovalent organic group, provided that $R^6$ is an epoxy-substituted monovalent organic group, and $0 \le M < 1$, $0 \le D1 < 1$, $0 < T1 \le 1$, $0 \le D2 < 1$, $0 \le T2 < 1$, $0 < M+D1+T1 \le 1$, and $M+D1+T1+D2+T2=1$,

[Chemical Formula 2]

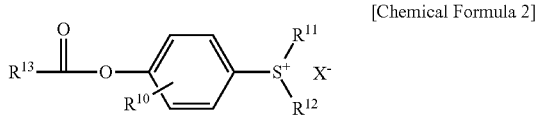

wherein, in Chemical Formula 2, $R^{10}$ to $R^{13}$ are independently hydrogen, a C1 to C4 alkyl group, or a C6 to C10 aryl group substituted or unsubstituted with a C1 to C4 alkyl group, and $X^-$ is a borate-based anion represented by Chemical Formula 3,

[Chemical Formula 3]

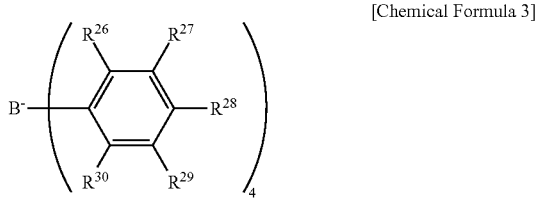

wherein, in Chemical Formula 3, $R^{26}$ to $R^{30}$ are independently F, Cl, Br, or I.

2. The low temperature curing composition according to claim 1, wherein the composition contains 20 wt % or less of the first epoxy group-containing siloxane compound and 80 wt % or greater of the second epoxy group-containing siloxane compound.

3. The low temperature curing composition according to claim 1, wherein, in Chemical Formula 1, about 35 mol % to 100 mol % of siloxane units have an epoxy-substituted organic group.

4. The low temperature curing composition according to claim 1, wherein, in Chemical Formula 1, $0 \leq M \leq 0.3$, $0 \leq D1 < 0.7$, $0.3 \leq T1 \leq 1$, $0 \leq D2 < 0.7$, $0 \leq T2 < 0.7$, $0 < M+D1+T1 \leq 1$, and $M+D1+T1+D2+T2=1$.

5. The low temperature curing composition according to claim 1, wherein the epoxy-substituted monovalent organic group comprises an epoxy-substituted monovalent aliphatic organic group, an epoxy-substituted monovalent alicyclic organic group, or an epoxy-substituted monovalent aromatic organic group, and wherein the epoxy-substituted monovalent aliphatic organic group comprises a glycidyl ether group or an oxetanyl ether group.

6. The low temperature curing composition according to claim 1, wherein the cationic thermal initiator for a ring-opening reaction of epoxide is included in an amount of about 0.01 wt % to about 5 wt % in the composition.

7. The low temperature curing composition according to claim 1, which further comprises a solvent.

8. The low temperature curing composition according to claim 1, which further comprises a polymerization inhibitor.

9. The low temperature curing composition according to claim 1, which is cured at a temperature of 100° C. or less.

10. A cured film obtained by curing the composition according to any of claim 1-5 or 6-9.

11. The cured film according to claim 10, which is an overcoat layer of an organic light emitting diode (OLED).

12. An electronic device comprising the cured film according to claim 10.

* * * * *